(12) United States Patent
Li

(10) Patent No.: US 6,478,082 B1
(45) Date of Patent: Nov. 12, 2002

(54) HEAT DISSIPATING APPARATUS WITH NEST WIND DUCT

(76) Inventor: Jia Hao Li, No. 2, Lane 127, Dang Ke St., Kang Shan Jen, Kao Hsiung Hsien (TW)

( * ) Notice: Subject to any disclaimer, the term of this patent is extended or adjusted under 35 U.S.C. 154(b) by 0 days.

(21) Appl. No.: 09/576,870

(22) Filed: May 22, 2000

(51) Int. Cl.⁷ .................................................. F28F 7/00
(52) U.S. Cl. ........................ 165/185; 165/80.3; 361/704; 361/709
(58) Field of Search ........................ 165/185, 80.3, 165/104.26, 104.33; 361/704, 709; 174/16.3; 257/722

(56) References Cited

U.S. PATENT DOCUMENTS

| | | | | |
|---|---|---|---|---|
| 3,149,666 A | * | 9/1964 | Coe | 165/121 |
| 3,180,404 A | * | 4/1965 | Nelson et al. | 165/80.3 |
| 4,505,326 A | * | 3/1985 | Hazen | 165/122 |
| 4,546,405 A | * | 10/1985 | Hultmark et al. | 165/80.3 |
| 4,884,631 A | * | 12/1989 | Rippel | 165/185 |
| 5,077,601 A | * | 12/1991 | Hatada et al. | 165/80.3 |
| 5,180,001 A | * | 1/1993 | Okada et al. | 165/80.4 |
| 5,535,816 A | * | 7/1996 | Ishida | 165/80.3 |
| 5,558,155 A | * | 9/1996 | Ito | 165/185 |
| 5,630,469 A | * | 5/1997 | Butterbaugh et al. | 165/80.3 |
| 5,735,372 A | * | 4/1998 | Nitta | 165/121 |
| 5,828,549 A | * | 10/1998 | Gandre et al. | 165/185 |
| 5,912,802 A | * | 6/1999 | Nelson | 361/695 |
| 6,026,890 A | * | 2/2000 | Akachi | 165/104.26 |
| 6,084,774 A | * | 7/2000 | Talbot et al. | 361/704 |
| 6,315,033 B1 | * | 11/2001 | Li | 165/185 |

\* cited by examiner

Primary Examiner—Henry Bennett
Assistant Examiner—Terrell L McKinnon
(74) Attorney, Agent, or Firm—Rosenberg, Klein & Lee

(57) ABSTRACT

A heat dissipating apparatus with nest wind duct is arranged corresponding to a horizontal flow of air. The heat dissipating apparatus is composed of nest wind duct with a plurality of through passages to form at least two vertical porous surfaces for the heat dissipating apparatus. The wind duct can be composed of strip fixture having element selected from the group consisting of thin rectangular pipe, circular pipe, hexagonal pipe or the composition thereof. Moreover, the wind duct also can be formed by integrally forging, extruding, casting porous ceramic or metal materials. Moreover, the wind duct also can be formed with strip and panel fixtures assembled by soldering, gluing, welding, brazing or sintering. Therefore, at least one lateral surface of the heat dissipating apparatus is in contact with a thermal source or a plate of heat transfer.

17 Claims, 11 Drawing Sheets

HEAT DISSIPATING APPARATUS WITH NEST WIND DUCT

FIELD OF THE INVENTION

The present invention relates to a heat dissipating apparatus with nest wind duct, especially to a heat dissipating apparatus with nest wind duct, which has fast heat conducting effect.

BACKGROUND OF THE INVENTION

The conventional heat dissipating apparatus of electronic device are generally designed for heat dissipation of CPU, i.e., for removing heat generated by the CPU out of the package. The heat dissipating apparatus become increasingly important as the speed of CPU increases. The conventional heat dissipating apparatus of electronic device can be classified to aluminum extrusion manifold type and heat pipe type. The aluminum extrusion manifold type heat dissipating apparatus comprises a bulky base integrally with a plurality of manifolds. The bulky base is in contact with electronic device requiring heat dissipation and the heat is dissipated only by the manifolds. The heat pipe type heat dissipating apparatus comprises a heat pipe connected with a plurality of heat dissipating plates. However, the heat dissipation is carried out only by the heat pipe and the heat dissipation is deteriorated when the heat pipe is slantingly arranged. Moreover, a multiple-plate composite heat dissipating apparatus is also proposed and much space is left for improvement.

It is the object of the invention to provide a heat dissipating apparatus with nest wind duct, the duct providing horizontal air flowing passages and having high porosity. The peripheral and inner part of the ducts have excellent thermal conducting effect.

To achieve the above object, the present invention provides a heat dissipating apparatus with nest wind duct arranged corresponding to a horizontal flow of air. The heat dissipating apparatus is composed of nest wind duct with a plurality of through passages to form at least two vertical porous surfaces for the heat dissipating apparatus. The wind duct can be composed of strip fixture having element selected from the group consisting of thin rectangular pipe, circular pipe, hexagonal pipe or the composition thereof. Moreover, the wind duct also can be formed by integrally forging, extruding, casting porous ceramic or metal materials. Moreover, the wind duct also can be formed with strip and panel fixtures assembled by soldering, gluing, welding, brazing or sintering. Therefore, at least one lateral surface of the heat dissipating apparatus is in contact with a thermal source or a plate of heat transfer.

The various objects and advantages of the present invention will be more readily understood from the following detailed description when read in conjunction with the appended drawing, in which:

DETAIL DESCRIPTION OF PREFERRED EMBODIMENT

Figure 1:
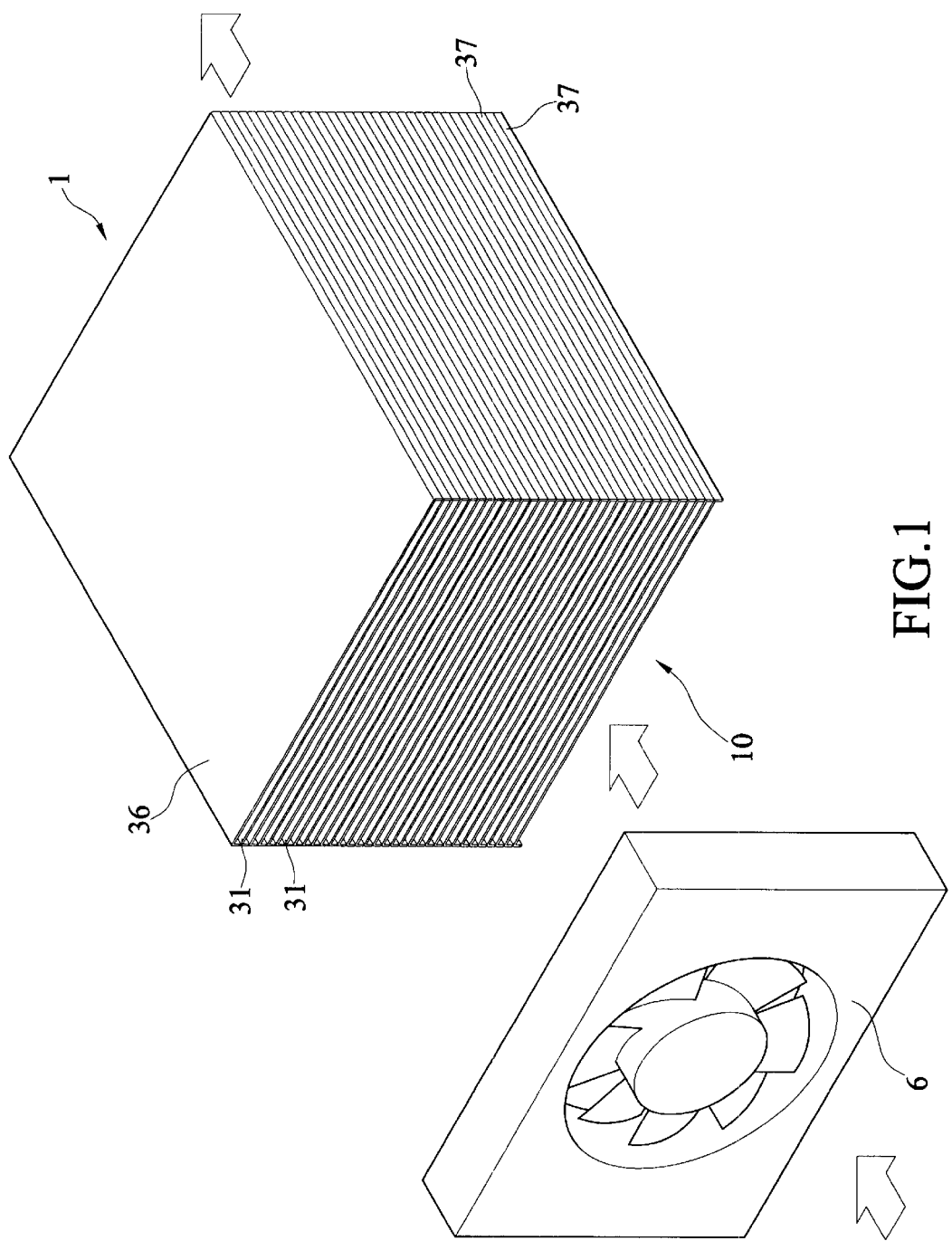
FIG. 1 is a perspective view of the present invention.

With reference now to FIGS. 1 to 11, the present invention is intended to provide a heat dissipating apparatus with nest wind duct. The nest-like heat dissipating apparatus 1 is arranged corresponding to a horizontal flow and comprises a wind duct structure 10. The wind duct structure 10 is composed of structure 4 integrally made of strip fixture 2 or panel fixture 3. The wind duct structure 10 is assembled to provide air-conducting or heat-exchange heat dissipating porous conduit. The shape of the wind duct structure 10 is extruding and continuous to achieve omni-directional heat dissipating. The strip fixture 2 is composed of thin rectangular pipe 21, circular pipe 22, hexagonal pipe 23, semi-circular pipe or octagonal pipe etc. The panel fixture 3 is formed by stacking plate 31 having ribs 32 or protrusions. The structure 4 is formed by forging, extruding, casting porous ceramics or metal or the combination of strip fixture 2 and panel structure 3 by soldering, gluing, welding, brazing or sintering. Therefore, at least one lateral side of the heat dissipating apparatus 1 is in contact with the thermal source 5 or plate of heat transfer 9. The wind duct structure 10 provides passages toward a fan 6 and a guiding hood 7 is provided between the fan 6 and the wind duct structure 10. A frame 8 is provided to cover the wind duct structure 10, alternatively, the frame 8 and the guiding hood 7 can be integrally formed.

Figure 9:
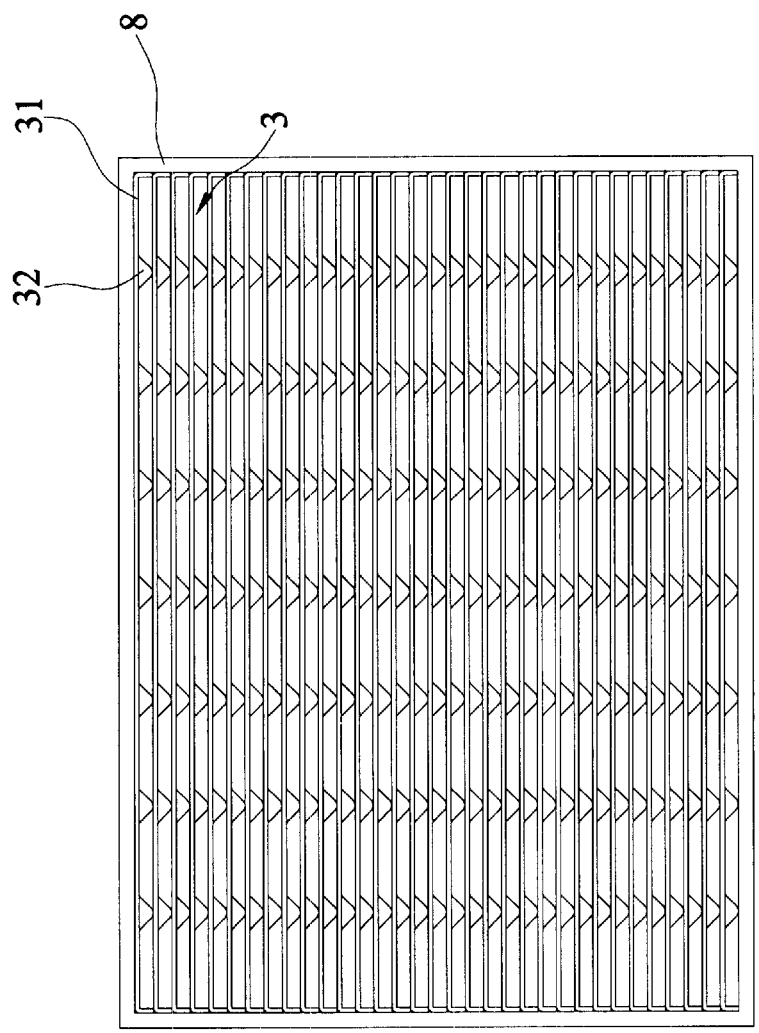
FIG. 9 is sectional view of the seventh embodiment of the present invention.

FIG. 1 shows the nest heat dissipating apparatus 1 composed of a plurality of panel fixtures 3. As shown in FIG. 9, the panel fixtures 3 comprises a plurality of plate 31 with integrally pressed horn-shaped protrusions 32. As shown in FIG. 1, the top of the nest-like heat dissipating apparatus 1 has a top plate 36, both sides of the plate 31 has downward-folded flange 37 to facilitate the stacking of the plate 31 on lateral side thereof. As shown in FIG. 1, a fan 6 is arranged corresponding to the air inlet or air outlet of the nest-like heat dissipating apparatus 1 and has a predetermined separation with the nest-like heat dissipating apparatus 1.

Figure 2:
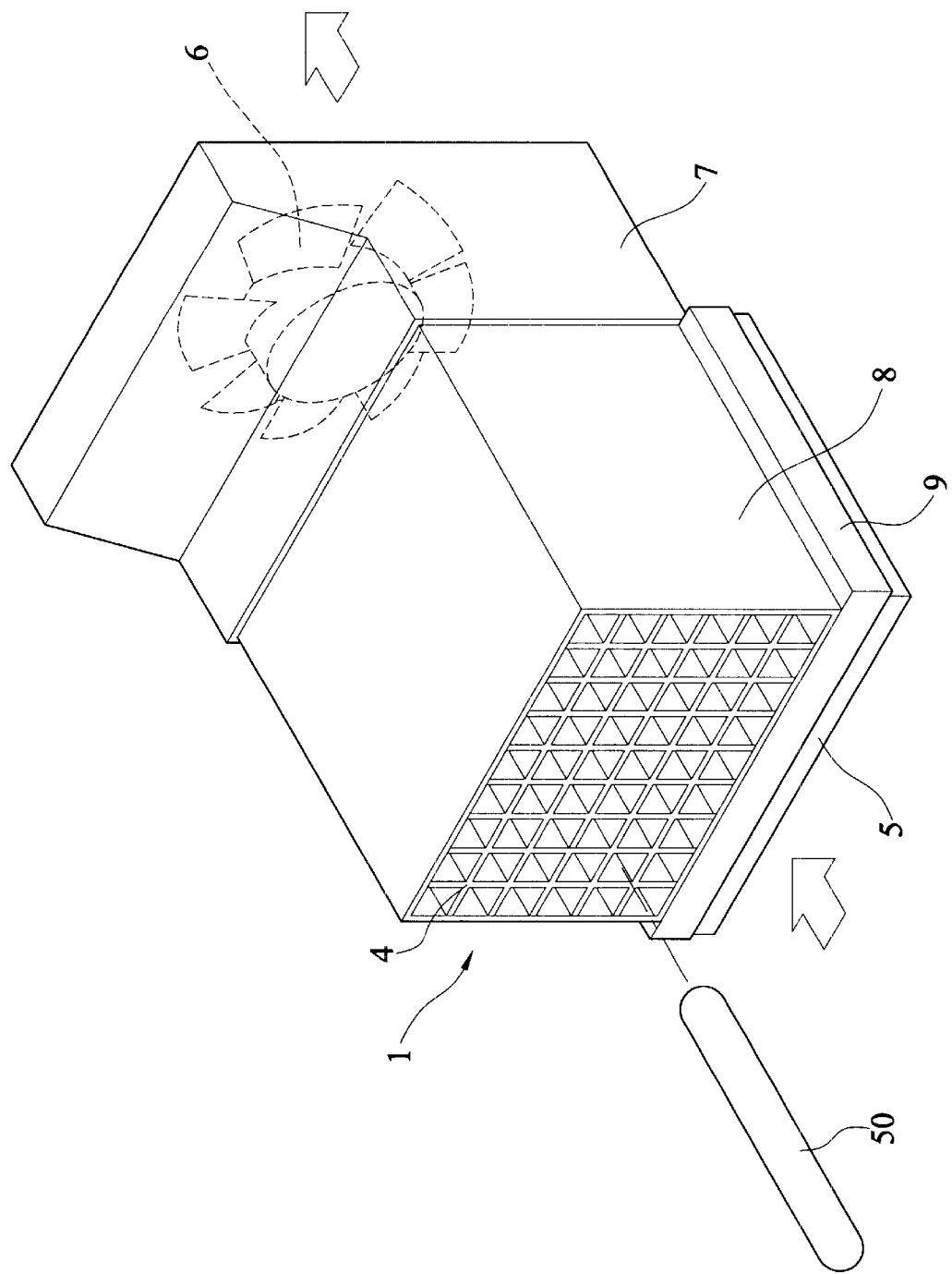
FIG. 2 is a perspective view of the preferred embodiment of the present invention.

FIG. 2 shows a perspective view of the preferred embodiment of the present invention. For practical application, the nest-like heat dissipating apparatus 1 is provided with the frame 8 on the perimeter thereof, the fan 6 and the guiding hood 7. The nest-like heat dissipating apparatus 1 comprises an integrally manufactured structure 4. For example, the structure 4 can be chessboard-like wind duct structure 10. The fan 6 is arranged within the guiding hood 7 and provide exhaust and blow effect. Therefore, the heat can be forced to remove. To guide the flow direction of the air, the guiding hood 7 is provided. In the present invention, the frame 8 is provided to receive heat from ambience. For example, heat form a thermal source 5 can be conducted to the nest-like heat dissipating apparatus 1 through the plate of heat transfer 9. Alternatively, as shown in FIG. 1, a heat pipe 50 is inserted to any hole of the structure 4, through which the heat is conducted to the chessboard-like wind duct structure 10. As shown in FIG. 2, heat can be transmitted to the chessboard-like wind duct structure 10 through upward, downward, left, right or inner directions. The plate of heat transfer 9 can be made of metal plate, ceramic plate, planar heat pipe.

Figure 3:
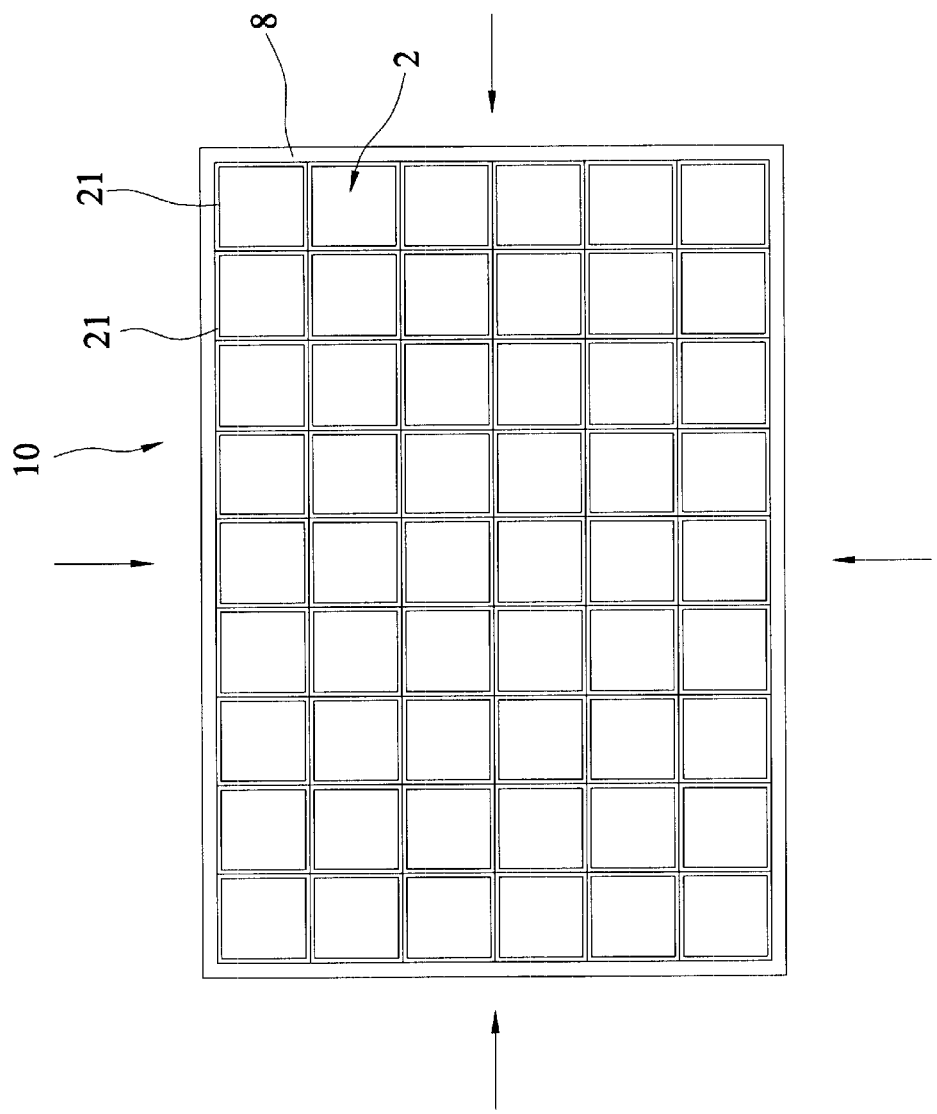
FIG. 3 is sectional view of the first embodiment of the present invention.
Figure 4:
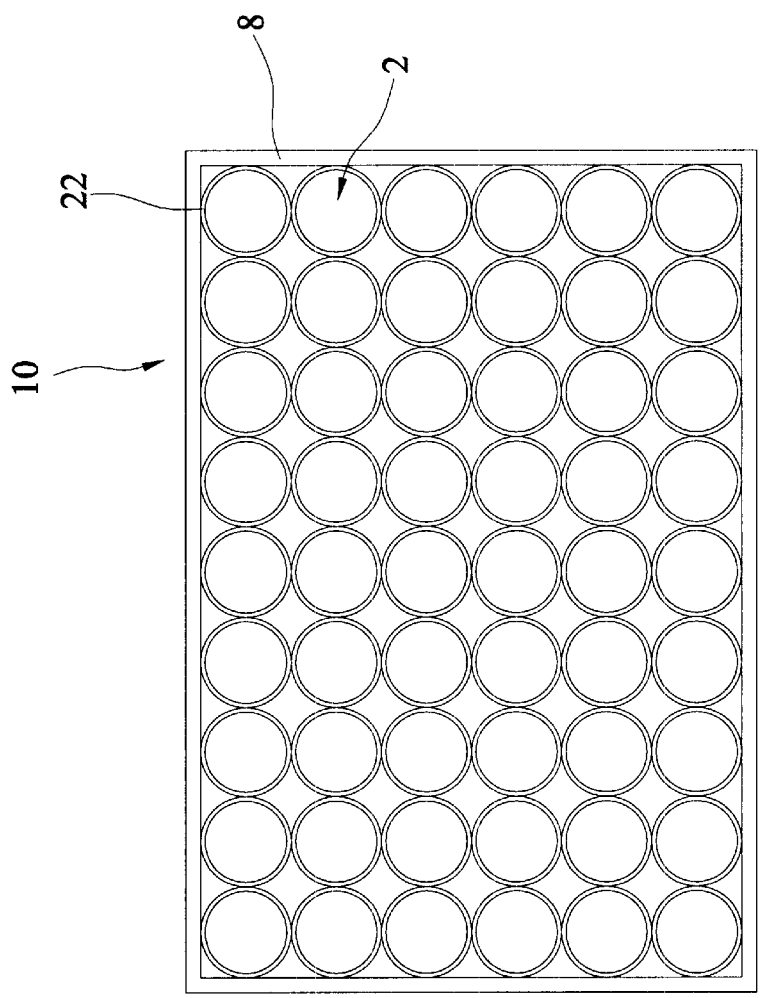
FIG. 4 is sectional view of the second embodiment of the present invention.
Figure 5:
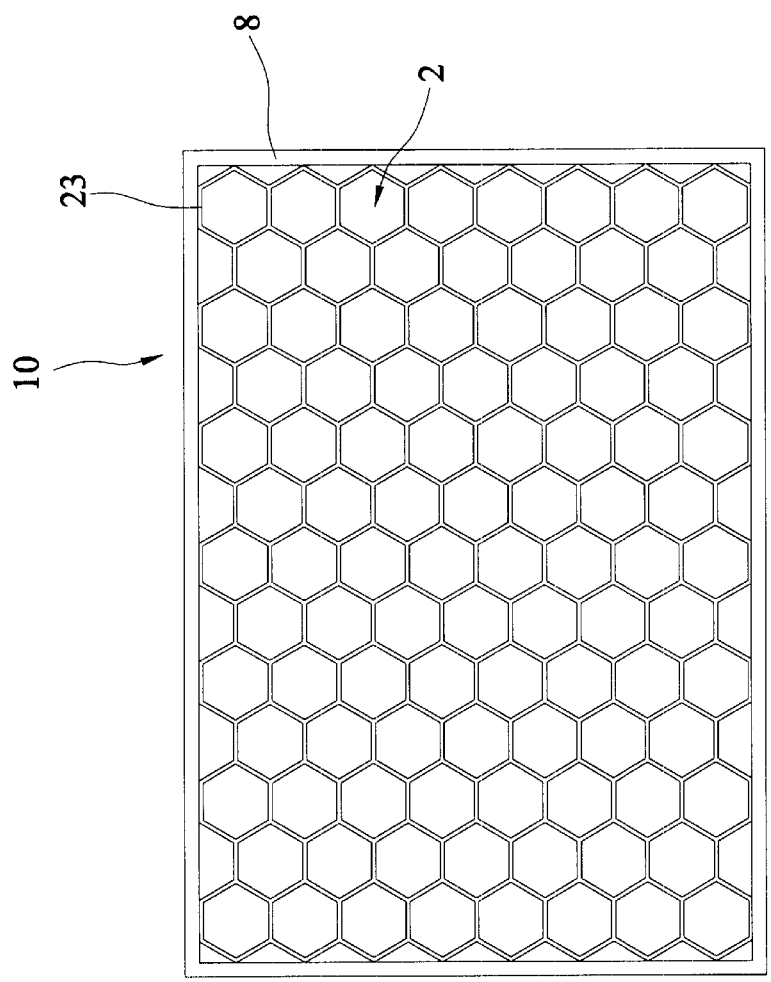
FIG. 5 is sectional view of the third embodiment of the present invention.
Figure 6:
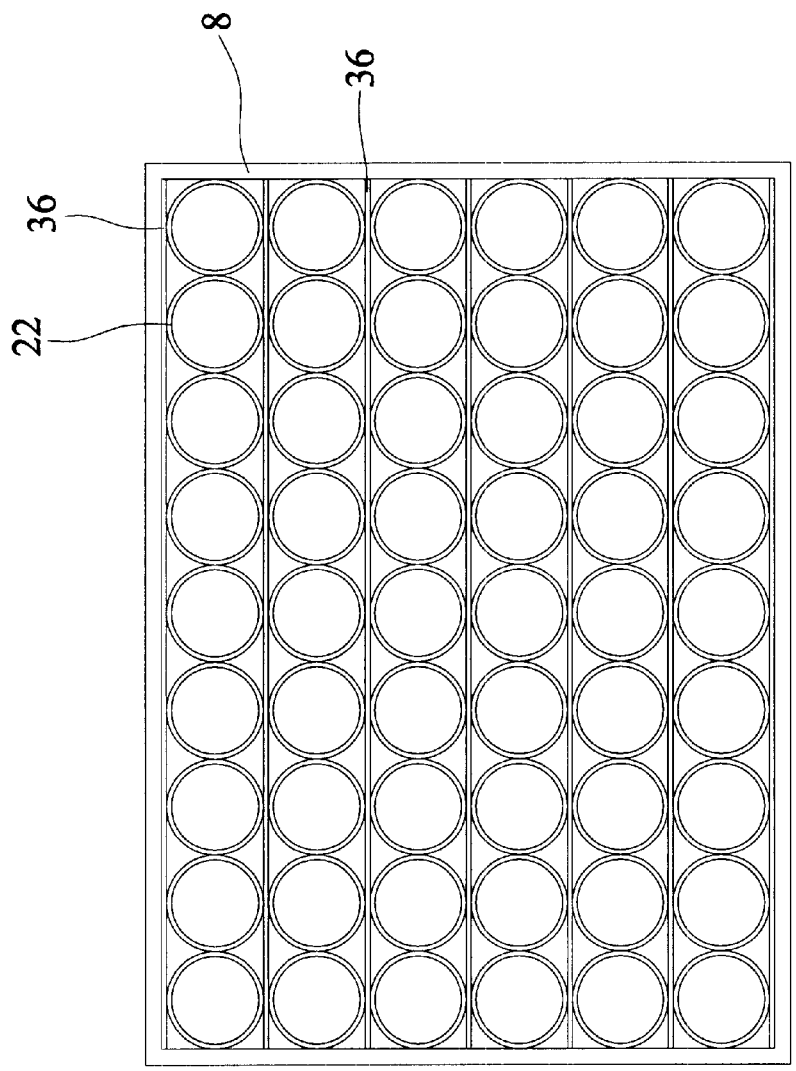
FIG. 6 is sectional view of the fourth embodiment of the present invention.
Figure 7:
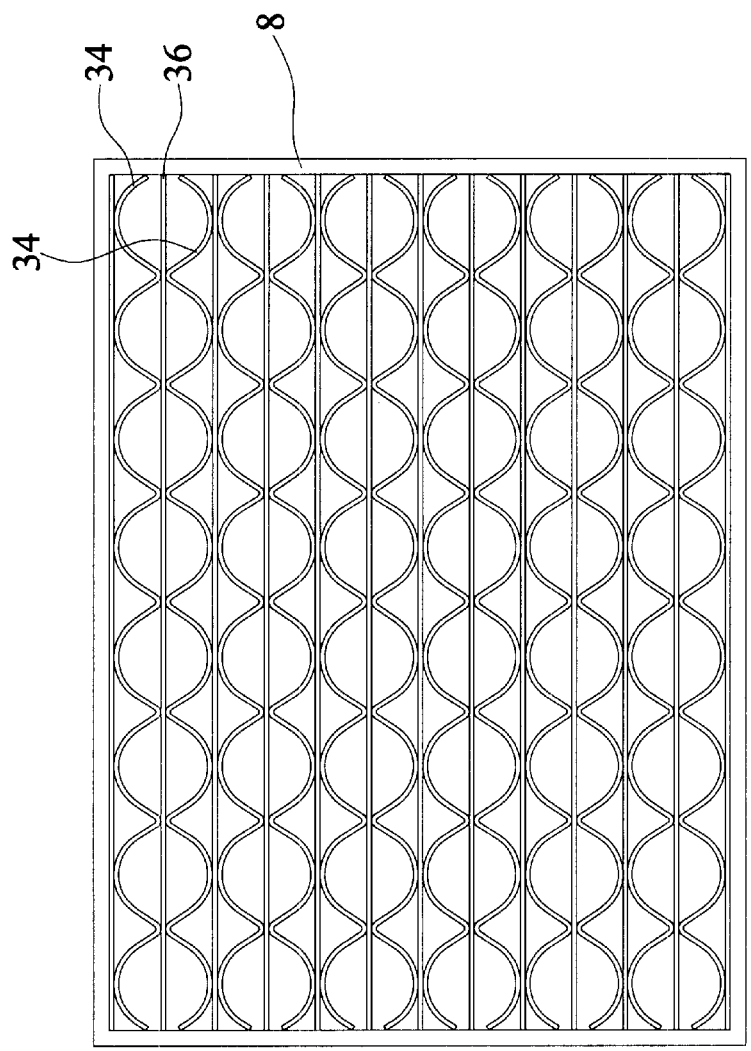
FIG. 7 is sectional view of the fifth embodiment of the present invention.
Figure 8:
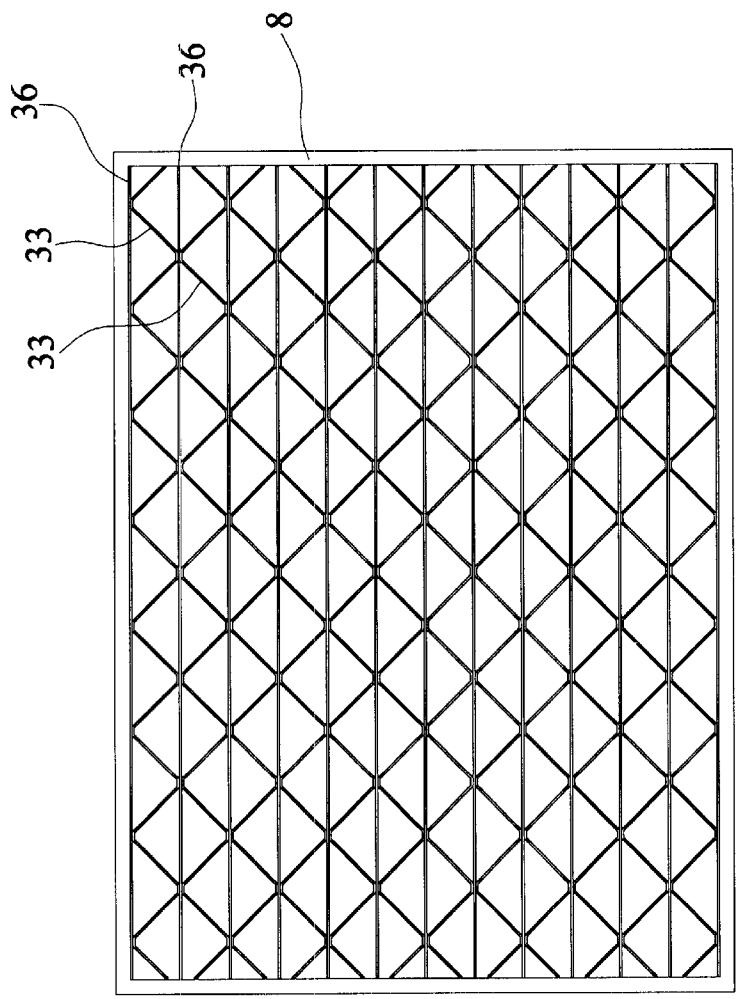
FIG. 8 is sectional view of the sixth embodiment of the present invention.
Figure 10:
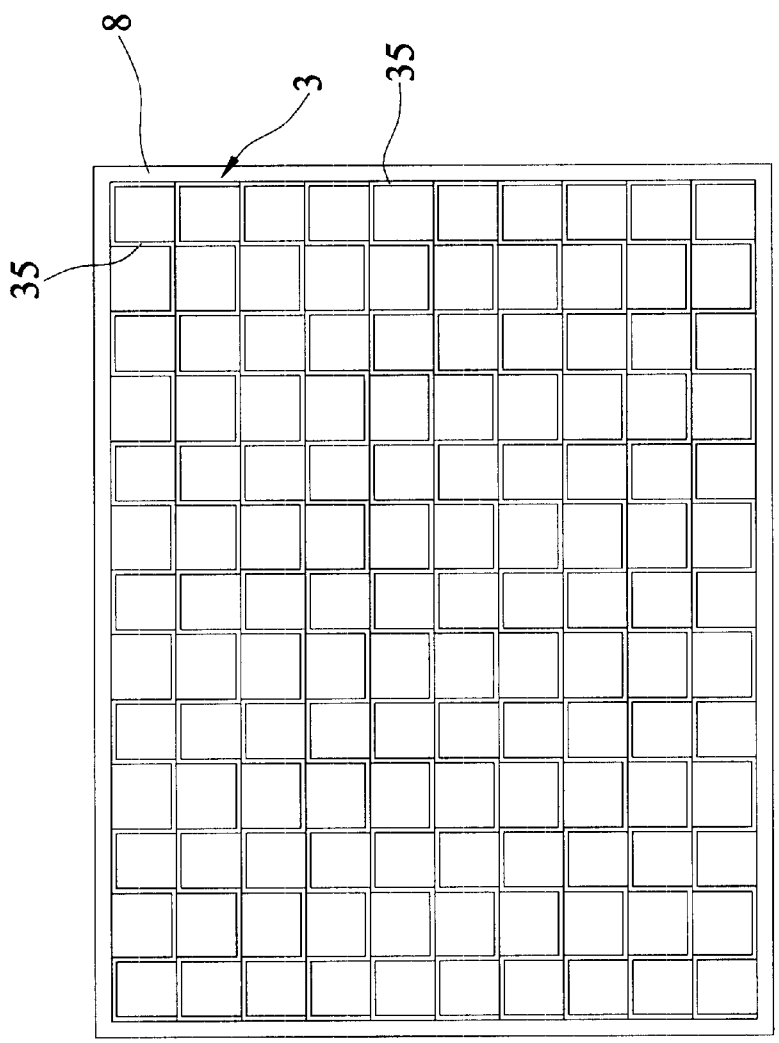
FIG. 10 is sectional view of the eighth embodiment of the present invention.
Figure 11:
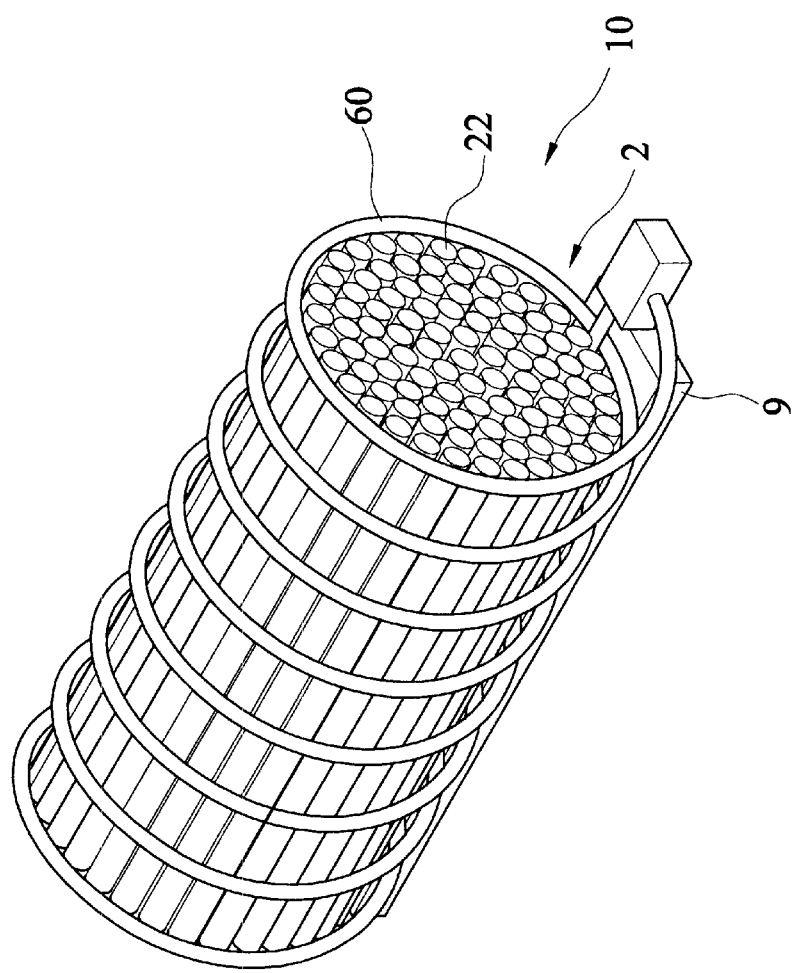
FIG. 11 is sectional view of the ninth embodiment of the present invention.

As shown in FIG. 3, the structure 4 is composed of rectangular conduit 21. As shown in FIG. 4, the structure 4 is composed of circular conduit 22. As shown in FIG. 5, the structure 4 is composed of hexagonal conduit 23. The above-mentioned three structures 4 are composed of simple element. FIG. 6 shows a composite structure wherein a circular conduit 22 is alternatively arranged with a planar plate 36. FIG. 7 shows another composite structure wherein a semi-circular conduit 34 is alternatively arranged with a planar plate 36 and two semi-circular conduits 34 form a circular shape. FIG. 8 shows still another composite structure wherein a plate 33 with triangular protrusions is alternatively arranged with a planar plate 36. FIG. 9 shows another composite structure wherein a plurality of planar plates 36 are stacked and separated by rib 32 to achieve compact structure. As shown in FIG. 10, the structure 4 is composed of rectangular corrugations 35. As shown in FIG. 11, a helicoid conduit 60 replace the frame 8, and a plurality of circular pipes 22 are bundled to form a beam structure 2 to replace the wind duct structure 10. Moreover, the wind duct structure 10 can be the configurations shown in FIGS. 3 to 11.

To sum up, the present invention provides a heat dissipating apparatus with nest wind ducts. The ducts provide horizontal communication and provide porous structure. The peripheral and inner part of the ducts have excellent thermal conducting effect. A heat pipe can be inserted into the conduit of the heat dissipating apparatus or a heat dissipating block can be assembled with the heat dissipating apparatus to enhance the heat dissipating effect.

Although the present invention has been described with reference to the preferred embodiment thereof, it will be understood that the invention is not limited to the details thereof. Various substitutions and modifications have suggested in the foregoing description, and other will occur to those of ordinary skill in the art. Therefore, all such substitutions and modifications are intended to be embraced within the scope of the invention as defined in the appended claims.

I claim:

1. A heat dissipating structure comprising:
   a fan for driving fluid flow in a longitudinal direction;
   a thermally conductive frame member longitudinally aligned with said fan, defining a plurality of longitudinally extending tubular members forming a longitudinally directed array of passages, each of said passages being partitioned each from the other, said each of said tubular members defining a thermal contact surface and being open on opposing sides thereof to allow fluid to continuously flow through each of said passages, each of said passages defining a continuous unidirectional fluid path parallel to said thermal contact surface for drawing thermal energy from a heat source in thermal communication with an external surface of said thermally conductive frame member, wherein each of said passages has a substantially rectangular cross-section.

2. The heat dissipating structure as recited in claim 1, wherein a thermally conductive plate is positioned between said thermally conductive frame member and said heat source, said thermally conductive plate being in thermal communication with both said thermally conductive frame member and said heat source.

3. The heat dissipating structure as recited in claim 1, wherein said thermally conductive frame member and said array of passages are formed from a thermally conductive metal material.

4. The heat dissipating structure as recited in claim 1, wherein said thermally conductive frame member has a substantially rectangular cross-section.

5. The heat dissipating structure as recited in claim 1, wherein said external surface of said thermally conductive frame member has a substantially arcuate contour.

6. The heat dissipating structure as recited in claim 2 herein said thermally conductive plate is formed of a thermally conductive metal material.

7. The heat dissipating structure as recited in claim 6 wherein a guiding hood structure is positioned between said fan and said thermally conductive frame member to form an enclosed fluid path between said fan and said array of passages.

8. The heat dissipating structure as recited in claim 1, wherein said array of passages is defined by a plurality of thermally conductive plate members stacked one on top of the other, each of said thermally conductive plate members having a set of ribs projecting therefrom, said ribs separating and thermally connecting consecutive thermally conductive plate members.

9. A heat dissipating structure comprising:
   a fan for driving fluid flow in a longitudinal direction;
   a thermally conductive frame member longitudinally aligned with said fan, defining a plurality of longitudinally extending tubular members forming a longitudinally directed array of passages, each of said passages being partitioned each from the other, said each of said tubular members defining a thermal contact surface and being open on opposing sides thereof to allow fluid to continuously flow through each of said passages, each of said passages defining a continuous unidirectional fluid path parallel to said thermal contact surface for drawing thermal energy from a heat source in thermal communication with an external surface of said thermally conductive frame member, wherein each of said passages has a substantially circular cross-section.

10. The heat dissipating structure as recited in claim 9, wherein a thermally conductive plate is positioned between said thermally conductive frame member and said heat source, said thermally conductive plate being in thermal communication with both said thermally conductive frame member and said heat source.

11. The heat dissipating structure as recited in claim 9, wherein said thermally conductive frame member and said array of passages are formed from a thermally conductive metal material.

12. The heat dissipating structure as recited in claim 10, wherein said thermally conductive plate is formed of a thermally conductive metal material.

13. The heat dissipating structure as recited in claim 12, wherein a guiding hood structure is positioned between said fan and said thermally conductive frame member to form an enclosed fluid path between said fan and said array of passages.

14. The heat dissipating structure as recited in claim 9, wherein said array of passages is defined by a plurality of thermally conductive plate members stacked one on top of the other, each of said thermally conductive plate members having a set of ribs projecting therefrom, said ribs separating and thermally connecting consecutive thermally conductive plate members.

15. The heat dissipating structure as recited in claim 9, wherein said thermally conductive frame member has a substantially rectangular cross-section.

16. A heat dissipating structure comprising:

a fan for driving fluid flow in a longitudinal direction;

a thermally conductive frame member longitudinally aligned with said fan, defining a plurality of longitudinally extending tubular members forming a longitudinally directed array of passages, each of said passages being partitioned each from the other, said each of said tubular members defining a thermal contact surface and being open on opposing sides thereof to allow fluid to continuously flow through each of said passages, each of said passages defining a continuous unidirectional fluid path parallel to said thermal contact surface for drawing thermal energy from a heat source in thermal communication with an external surface of said thermally conductive frame member, wherein said thermally conductive frame member and said array of passages are formed from a thermally conductive porous ceramic material.

17. A heat dissipating structure comprising:

a fan for driving fluid flow in a longitudinal direction;

a thermally conductive frame member longitudinally aligned with said fan, defining a plurality of longitudinally extending tubular members forming a longitudinally directed array of passages, each of said passages being partitioned each from the other, said each of said tubular members defining a thermal contact surface and being open on opposing sides thereof to allow fluid to continuously flow through each of said passages, each of said passages defining a continuous unidirectional fluid path parallel to said thermal contact surface for drawing thermal energy from a heat source in thermal communication with an external surface of said thermally conductive frame member, wherein a helical thermally conductive pipe is positioned around, and is in thermal contact with, said thermally conductive frame member.

\* \* \* \* \*